US010317049B2

(12) United States Patent
Inoue et al.

(10) Patent No.: US 10,317,049 B2
(45) Date of Patent: Jun. 11, 2019

(54) LIGHT IRRADIATION DEVICE

(71) Applicant: USHIO DENKI KABUSHIKI KAISHA, Tokyo (JP)

(72) Inventors: Takahiro Inoue, Tokyo (JP); Takeo Matsushima, Tokyo (JP); Toshihiro Nakajima, Tokyo (JP); Junichi Kinoshita, Tokyo (JP); Kenji Ishida, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/776,749

(22) PCT Filed: Nov. 2, 2016

(86) PCT No.: PCT/JP2016/082564
§ 371 (c)(1),
(2) Date: May 16, 2018

(87) PCT Pub. No.: WO2017/086160
PCT Pub. Date: May 26, 2017

(65) Prior Publication Data
US 2018/0372308 A1 Dec. 27, 2018

(30) Foreign Application Priority Data
Nov. 16, 2015 (JP) .................. 2015-224291

(51) Int. Cl.
*F21S 2/00* (2016.01)
*H05K 1/02* (2006.01)
(Continued)

(52) U.S. Cl.
CPC ............ *F21V 19/0025* (2013.01); *F21S 2/00* (2013.01); *F21V 23/00* (2013.01); *H05K 1/0296* (2013.01);
(Continued)

(58) Field of Classification Search
CPC .................................................. H05K 1/0296
See application file for complete search history.

(56) References Cited

U.S. PATENT DOCUMENTS 6,422,716 B2* 7/2002 Henrici ................... F21S 2/005
257/E25.032
7,897,980 B2* 3/2011 Yuan ......................... F21K 9/00
257/79
(Continued)

FOREIGN PATENT DOCUMENTS

| JP | 2011-103261 A | 5/2011 |
| WO | 2011/129202 A1 | 10/2011 |
| WO | 2012/095929 A1 | 7/2012 |

OTHER PUBLICATIONS

International Search Report issued in PCT/JP2016/082564; dated Jan. 17, 2017.
(Continued)

*Primary Examiner* — Alexander K Garlen
(74) *Attorney, Agent, or Firm* — Studebaker & Brackett PC

(57) ABSTRACT

A light irradiation device includes a plurality of light-emitting portions that emit light by being supplied with a current. The light-emitting portions each have a first power supply terminal, and a second power supply terminal; a plurality of light-emitting elements; and a wiring pattern. The wiring pattern has a first wiring region and a second wiring region. Two of the light-emitting portions that are disposed adjacent to each other are disposed such that the space between the respective first wiring regions or the space between the respective second wiring regions is smaller than the space between the first wiring region of one of the light-emitting portions and the second wiring region of the other of the light-emitting portions.

16 Claims, 11 Drawing Sheets

(51) Int. Cl.
- *F21V 19/00* (2006.01)
- *F21V 23/00* (2015.01)
- *F21Y 103/10* (2016.01)
- *F21Y 115/10* (2016.01)

(52) U.S. Cl.
CPC ....... *F21Y 2103/10* (2016.08); *F21Y 2115/10* (2016.08); *H05K 1/02* (2013.01); *H05K 2201/10106* (2013.01)

(56) References Cited

U.S. PATENT DOCUMENTS

| | | | | |
|---|---|---|---|---|
| 8,511,853 B2* | 8/2013 | Chen | ................... | F21V 19/0025 257/99 |
| 8,921,873 B2* | 12/2014 | Takeda | ................ | H01L 25/0753 257/88 |
| 2002/0113246 A1* | 8/2002 | Nagai | ....................... | F21K 9/90 257/99 |
| 2012/0091489 A1* | 4/2012 | Aoki | ......................... | F21K 9/00 257/98 |
| 2013/0038246 A1 | 2/2013 | Sasano | | |
| 2013/0146937 A1 | 6/2013 | Omura et al. | | |
| 2013/0170213 A1* | 7/2013 | Huang | ................. | H05K 1/0296 362/249.06 |
| 2014/0369042 A1* | 12/2014 | Hsu | ......................... | F21V 23/00 362/249.01 |
| 2015/0016109 A1* | 1/2015 | Ogata | ................... | H01L 41/047 362/249.02 |

OTHER PUBLICATIONS

Notification of Transmittal of Translation of the International Preliminary Report on Patentability and Translation of Written Opinion of the International Searching Authority; PCT/JP2016/082564; dated May 31, 2018.

* cited by examiner

LIGHT IRRADIATION DEVICE

TECHNICAL FIELD

The present invention relates to a light irradiation device.

BACKGROUND ART

A light curing material that is cured by irradiation with light is known. The light curing material has advantages such that this is cured in a short time, curable without increasing temperature of an irradiated object, and environmentally friendly. Therefore, the light curing materials are used in various applications such as bonding of electronic parts or optical parts, printing technology using the light curing materials as printing ink, and the like.

In addition, an exposure technology of performing microfabrication using light is known. The exposure technology is used, for example, for manufacturing an electrode pattern of an LED and in a manufacturing process of micro electro mechanical systems (MEMS) represented by an acceleration sensor.

In these technologies, a discharge lamp with high luminance has been used as a light source. However, with the progress of a solid-state light source technology in recent years, it is studied to use a light source obtained by arranging a plurality of light emitting elements such as LED elements in place of a discharge lamp.

FIG. 9 illustrates a light irradiation device 100 in Patent Document 1. The light irradiation device 100 includes light emitting units (103, 104, 105, 106, 107, and 108) arranged in two rows and three columns. Each of the light emitting units is formed of eight light emitting elements 109 connected in series. Each light emitting unit is connected in parallel to a power supply. In addition, the light emitting elements 109 are arranged in an x direction and a y direction at an interval of 4.6 mm. In each of the light emitting units (103, 104, and 105) in a first row, the light emitting element 109 located on a left end of the drawing is connected to an anode side of the power supply, and the light emitting element 109 located on a right end of the drawing is connected to a cathode side of the power supply. In each of the light emitting units (106, 107, and 108) in a second row, the light emitting element 109 located on the right end of the drawing is connected to the anode side of the power supply, and the light emitting element 109 located on the left end of the drawing is connected to the cathode side of the power supply.

PRIOR ART DOCUMENT

Patent Document

Patent Document 1: JP-A-2011-103261

SUMMARY OF THE INVENTION

Problems to be Solved by the Invention

In recent years, in order to achieve high illuminance of a light irradiation device, it is required to arrange a large number of light emitting elements in a light source. Also, from the viewpoint of miniaturizing the light irradiation device, it is required to decrease an arrangement interval of the light emitting elements.

Therefore, the inventors of the present invention studied a configuration in which a large number of light emitting elements are connected to each light emitting unit and further the arrangement interval of the light emitting elements is narrowed, and found the following problem. This is described in detail below.

The inventors of the present invention connected a large number of light emitting elements in series, and further connected these light emitting elements in parallel, thereby increasing the number of light emitting elements included in the light emitting unit. When current was supplied to each light emitting unit, it was confirmed that discharge occurred along a surface of a substrate at a boundary between adjacent light emitting units. Specifically, taking the light irradiation device 100 of Patent Document 1 as an example, the discharge occurred at the boundary between the light emitting unit 103 and the light emitting unit 104 and at the boundary between the light emitting unit 106 and the light emitting unit 107.

The above-described discharge is referred to as creeping discharge. The creeping discharge is the discharge that occurs along a surface of an insulator as high voltage is applied between conductors such as electrodes placed on the insulator. The creeping discharge occurs when a distance along the surface of the insulator between the two conductors, that is, a creeping distance is shorter than a minimum creeping distance. The minimum creeping distance is a minimum value of the creeping distance at which the creeping discharge does not occur, and is defined, for example, in safety standards IEC 60950 regarding information technology equipment. According to the standards, the minimum creeping distance is determined according to a potential difference between the two electrodes; the larger the potential difference, the larger the minimum creeping distance, and the smaller the potential difference, the smaller the minimum creeping distance.

When the creeping discharge occurs, the current which should be originally supplied to the light emitting unit leaks, so that the light emitting element does not emit light or the light emitting element might break. Therefore, it is necessary to suppress the occurrence of the creeping discharge.

Herein, it is expected that the occurrence of the creeping discharge may be prevented by separating the two light emitting units in which the creeping discharge occurs by the minimum creeping distance defined in the above standards. However, when the interval between the light emitting units is increased, mounting density of the light emitting elements per unit area decreases, so that high density mounting of the light emitting elements cannot be achieved. Therefore, it is desirable to realize a technology of suppressing the creeping discharge without increasing the interval between the light emitting units.

An object of the present invention is to provide a technology capable of realizing both the suppression of the occurrence of the creeping discharge and the high density mounting of light emitting elements.

Means for Solving the Problem

A light irradiation device according to the present invention is a light irradiation device including a plurality of light emitting units that emit light when current is supplied, in which each of the plurality of light emitting units includes a first feeding terminal indicating anode polarity and a second feeding terminal indicating cathode polarity connected to a power supply, a plurality of light emitting elements, and
a wiring pattern formed so as to electrically connect the first feeding terminal, the plurality of light emitting elements, and the second feeding terminal in series, the wiring pattern includes
a first wiring area located between the first feeding terminal and a light emitting element arranged in a position electrically the closest to the first feeding terminal, and
a second wiring area located between the second feeding terminal and a light emitting element arranged in a position electrically the closest to the second feeding terminal, and
in two adjacently arranged light emitting units out of the plurality of light emitting units, first wiring areas or second wiring areas are arranged with an interval narrower than an interval between the first wiring area of one light emitting unit and the second wiring area of the other light emitting unit.

According to the above-described configuration, in the two adjacently arranged light emitting units, the wiring areas of the same polarity are arranged at a relatively narrow interval and the wiring areas of different polarity are arranged at a relatively wide interval. As a result, a potential difference between the adjacent wiring areas can be decreased, so that occurrence of creeping discharge can be suppressed. Furthermore, it is possible to make the arrangement interval of the two light emitting units relatively narrow. As described above, according to the above-described configuration, it is possible to realize both the suppression of the occurrence of the creeping discharge and high density mounting of the light emitting elements.

Also, in the above-described configuration,
in two adjacently arranged light emitting units out of the plurality of light emitting units, a direction from the first wiring area to the second wiring area in one light emitting unit may be different from a direction from the first wiring area to the second wiring area in the other light emitting unit.

According to the above-described configuration, when arranging the light emitting units in a direction parallel to the direction from the first wiring area to the second wiring area, the interval between the adjacent light emitting units can be made relatively small. That is, it is possible to arrange the light emitting elements at high density in this direction. It is described in detail in the section of the mode for carrying out the invention.

Also, in the above-described configuration,
in two adjacently arranged light emitting units out of the plurality of light emitting units, a direction from the first wiring area to the second wiring area in one light emitting unit may be opposite to a direction from the first wiring area to the second wiring area in the other light emitting unit.

Also, in the above-described configuration,
in all the adjacently arranged light emitting units out of the plurality of light emitting units, the first wiring areas or the second wiring areas may be arranged with the interval narrower than the interval between the first wiring area of one light emitting unit and the second wiring area of the other light emitting unit.

According to the above-described configuration, in all the adjacently arranged light emitting units, the wiring areas of the same polarity are arranged at a relatively narrow interval and the wiring areas of different polarity are arranged at a relatively wide interval. This makes it possible to further suppress the occurrence of the creeping discharge.

Also, in the above-described configuration,
each of the plurality of light emitting units may include two first feeding terminals and two second feeding terminals, and
the first feeding terminals may be arranged so as to face each other across the plurality of light emitting elements and the second feeding terminals may be arranged so as to face each other across the plurality of light emitting elements.

According to the above-described configuration, the two feeding terminals of the same polarity are arranged so as to interpose the plurality of light emitting elements therebetween. As a result, it is possible to prevent the feeding terminal from disturbing the high density mounting of the light emitting elements. It is described in detail in the section of the mode for carrying out the invention.

Also, in the above-described configuration,
a plurality of substrates may be included, and
the plurality of light emitting units may be mounted on different substrates.

Effect of the Invention

According to the light irradiation device of the present invention, it is possible to realize high density mounting of the light emitting elements while suppressing occurrence of creeping discharge.

MODE FOR CARRYING OUT THE INVENTION

Figure 1:
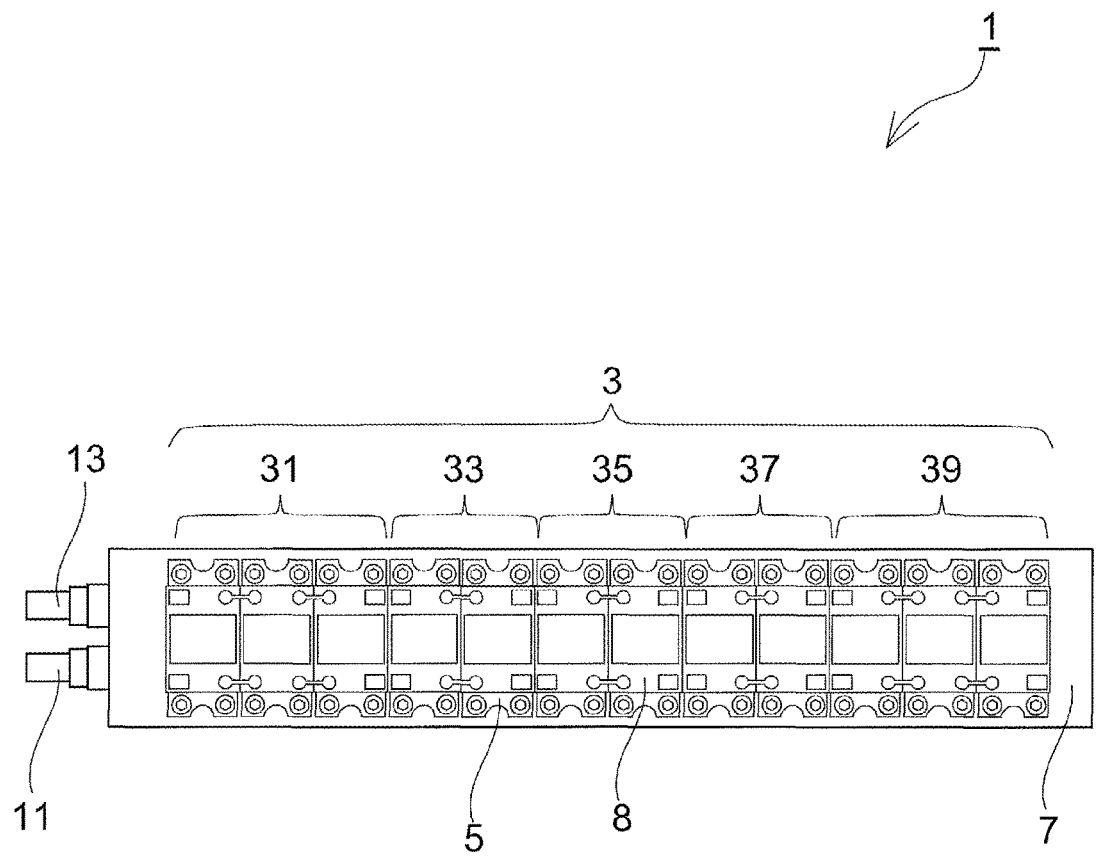
FIG. 1 is a view schematically illustrating a configuration of a first embodiment of a light irradiation device of the present invention.

A light irradiation device of an embodiment is described with reference to the drawings. Meanwhile, in each drawing, a dimensional ratio in the drawing and an actual dimensional ratio do not always coincide with each other.

(First Embodiment)
[Configuration]

A configuration of a light irradiation device 1 in a first embodiment is described. The light irradiation device 1 is used as a light source of a printing device and an exposure device as an example. FIG. 1 is a schematic diagram of the light irradiation device 1 of this embodiment. The light irradiation device 1 is provided with a light emitting unit 3, a heat sink 5, and a water cooling block 7. In this embodiment, as an example, the light emitting unit 3 of the light irradiation device 1 is formed of five light emitting units (31, 33, 35, 37, and 39).

Meanwhile, in FIG. 1, a direction in which the five light emitting units (31, 33, 35, 37, and 39) are arranged is an x direction, and a direction orthogonal to the x direction is a y direction.

Each of the light emitting units (31 and 39) includes three LED substrates 8 arranged side by side in the x direction. Each of the light emitting units (33, 35, and 37) includes two LED substrates 8 arranged side by side in the x direction. In this manner, the light emitting unit 3 includes 12 LED substrates 8.

On each LED substrate 8, a large number of LED elements (not illustrated) are arranged. In FIG. 1, an area in which the LED elements are arranged is illustrated as a rectangle for convenience. The LED element that emits ultraviolet light having a wavelength of 365 nm is arranged on the LED substrate 8 of the light emitting units (31, 35, and 39), and the LED element that emits ultraviolet light having the wavelength of 405 nm is arranged on the LED substrate 8 of the light emitting units (33 and 37).

As described above, since the number of the LED substrates 8 is larger in the light emitting units (31 and 39) than in the light emitting units (33, 35, and 37), the number of the arranged LED elements is also larger than that of the light emitting units (33, 35, and 37). Therefore, the light emitting units (31 and 39) are connected to a power supply capable of supplying higher voltage than that of the light emitting units (33, 35, and 37). As an example, the light emitting units (31, 39) are connected to a power supply capable of supplying voltage of 192 V, and the light emitting units (33, 35, and 37) are connected to a power supply capable of supplying voltage of 128 V.

In this embodiment, the light emitting units (31, 33, 35, 37, and 39) are connected to different power supplies. Meanwhile, it is also possible that two power supplies which are the power supply capable of supplying 192 V and the power supply capable of supplying 128 V are prepared, and the light emitting units (31 and 39) share the power supply of 192 V and the light emitting units (33, 35, and 37) share the power supply of 128 V.

The light emitting unit 3 is described later in detail.

On upper surfaces of the 12 heat sinks 5, 12 LED substrates 8 are attached. The heat sink 5 conducts heat generated when the light emitting unit 3 is energized to the water cooling block 7. As an example, the heat sink 5 is made of copper (Cu).

The heat sink 5 is attached on an upper surface of the water cooling block 7. The water cooling block 7 discharges the heat from the heat sink 5 out of the light irradiation device 1. Specifically, cooling water flows from one piping joint 11, passes through the water cooling block 7, and circulates to the other piping joint 13, so that the light emitting unit 3 is cooled.

[Configuration of Light Emitting Unit]

Figure 2:
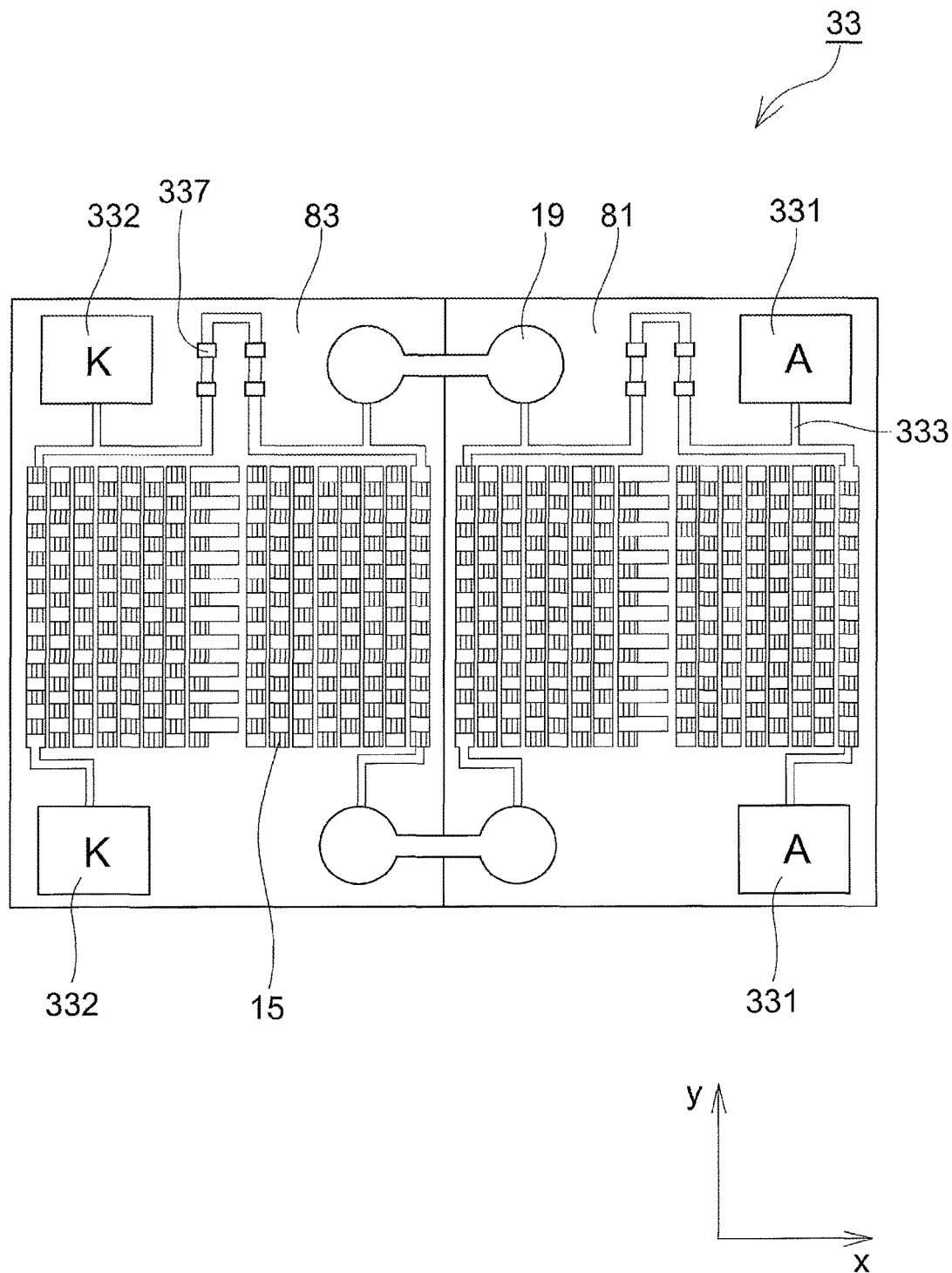
FIG. 2 is a view schematically illustrating a configuration of a light emitting unit.

Subsequently, the light emitting unit 3 is described. As an example, the light emitting unit 33 is described with reference to FIG. 2. FIG. 2 is a view schematically illustrating the light emitting unit 33 out of the light emitting unit 3 in FIG. 1.

As described above, the light emitting unit 33 includes two LED substrates (81 and 83) arranged in the x direction. The light emitting unit 33 includes a first feeding terminal 331, a second feeding terminal 332, an LED element 15, a wiring pattern 333, and a Zener diode 337 on the two LED substrates (81 and 83). Meanwhile, in FIG. 2, the LED element 15 is marked with a vertical line.

Two first feeding terminals 331 are provided at corners on an x direction side of the LED substrate 81. Two second feeding terminals 332 are provided at corners on a −x direction side of the LED substrate 83. The first feeding terminal 331 and the second feeding terminal 332 are connecting terminals for supplying power from an external power supply to the LED element 15. In this embodiment, the first feeding terminal 331 is connected to an anode side, that is, a high potential side of the external power supply, and the second feeding terminal 332 is connected to a cathode side, that is, a low potential side of the external power supply. Meanwhile, in FIG. 2, the first feeding terminal 331 indicating anode polarity is marked with "A" and the second feeding terminal 332 indicating cathode polarity is marked with "K". The same applies to FIG. 3 and subsequent drawings.

A large number of LED elements 15 are arranged on the LED substrates (81 and 83). In this embodiment, as an example, 160 LED elements 15 are arranged on each LED substrate (81 and 83). On each LED substrate (81 and 83), 10 LED elements 15 are arranged in the y direction and 16 LED elements 15 are arranged in the x direction. Meanwhile, the 10 LED elements 15 arranged in the y direction are arranged such that coordinates thereof in the y direction are shifted from those of the 10 adjacent LED elements 15. That is, the LED elements 15 are arranged in a checkered pattern. Meanwhile, the LED element 15 corresponds to a "light emitting element".

The wiring pattern 333 is metal wiring formed on the LED substrate 8 using a metal material such as copper (Cu) as an example. The wiring pattern 333 electrically connects the first feeding terminal 331, the LED elements 15 arranged on each LED substrate (81 and 83), and the second feeding terminal 332. The wiring pattern 333 is described later in detail.

The Zener diode 337 is an element for protecting the LED element 15 from overvoltage and static electricity. The Zener diode 337 is connected in parallel to the power supply to which the first feeding terminal 331 and the second feeding terminal 332 are connected. Meanwhile, it is not required that the light emitting unit 33 include the Zener diode 337.

Subsequently, the wiring pattern 333 is described with reference to FIG. 3.

Figure 3:
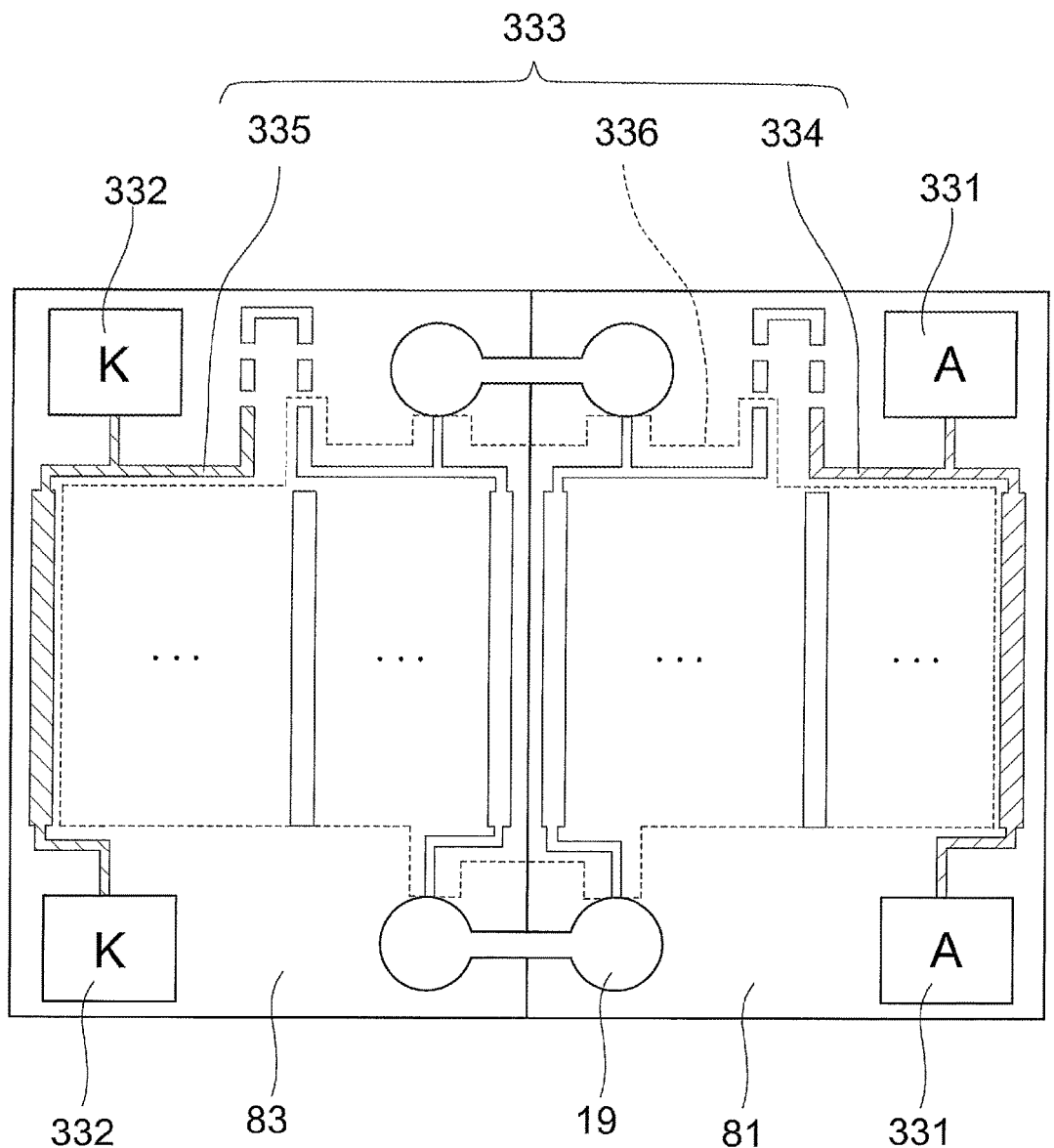
FIG. 3 is a schematic diagram for illustrating a wiring pattern.

FIG. 3 illustrates the wiring pattern 333 formed on the LED substrate (81 and 83). As illustrated in FIG. 3, the wiring pattern 333 includes a first wiring area 334, a second wiring area 335, and an intermediate area 336. In FIG. 3, for the sake of convenience, the first wiring area 334 is marked with a right diagonal line and the second wiring area 335 is marked with a left diagonal line. Also, the intermediate area 336 is surrounded by a broken line.

In this embodiment, as an example, 16 columns of wiring patterns 333 are formed on each of the LED substrates (81 and 83). Meanwhile, in FIG. 3, for the sake of convenience, the LED element 15 and the intermediate area 336 of a part of the wiring pattern 333 are not illustrated.

The first wiring area 334 is connected to the first feeding terminal 331 and has the same potential as the first feeding terminal 331. The second wiring area 335 is connected to the second feeding terminal 332 and has the same potential as the second feeding terminal 332. That is, in the wiring pattern 333, the potential of the first wiring area 334 is the highest and the potential of the second wiring area 335 is the lowest. The intermediate area 336 is formed between the first wiring area 334 and the second wiring area 335.

The LED element 15 is arranged on the wiring pattern 333. Specifically, 10 LED elements 15 are arranged in the first wiring area 334, and 10 LED elements 15 are arranged in the second wiring area 335. Furthermore, the 10 LED elements 15 are arranged in each column of the intermediate area 336.

Although not illustrated, each LED element 15 arranged on the wiring pattern 333 is connected to the wiring pattern 333 to the left by wire. As a result, the 16 LED elements arranged in the x direction on each LED substrate (81 and 83) are electrically connected in series.

In addition, the LED substrates (81 and 83) are connected to each other by a connecting member 19. The connecting member 19 having conductivity is made of metal, for example. Therefore, the 16 LED elements 15 arranged in the x direction are electrically connected in series to one another. That is, 32 LED elements 15 arranged in the x direction are electrically connected in series to one another.

Furthermore, in this embodiment, 10 groups of 32 LED elements 15 electrically connected in series are arranged between the first wiring area 334 and the second wiring area 335. That is, the 10 groups of LED elements 15 are electrically connected in parallel between the first feeding terminal 331 and the second feeding terminal 332.

Although the light emitting unit 33 is described above, other light emitting units (31, 35, 37, and 39) have the similar configuration. That is, the other light emitting units (31, 35, 37, and 39) also include two or three LED substrates 8, two first feeding terminals, two second feeding terminals, the LED element 15, the wiring pattern electrically connecting the first feeding terminal, the LED element 15, and the second feeding terminal, and the Zener diode as the light emitting unit 33.

[Polarity]

Subsequently, with reference to FIG. 4A and FIG. 4B, polarity in adjacent light emitting units is described.

Figure 4A:
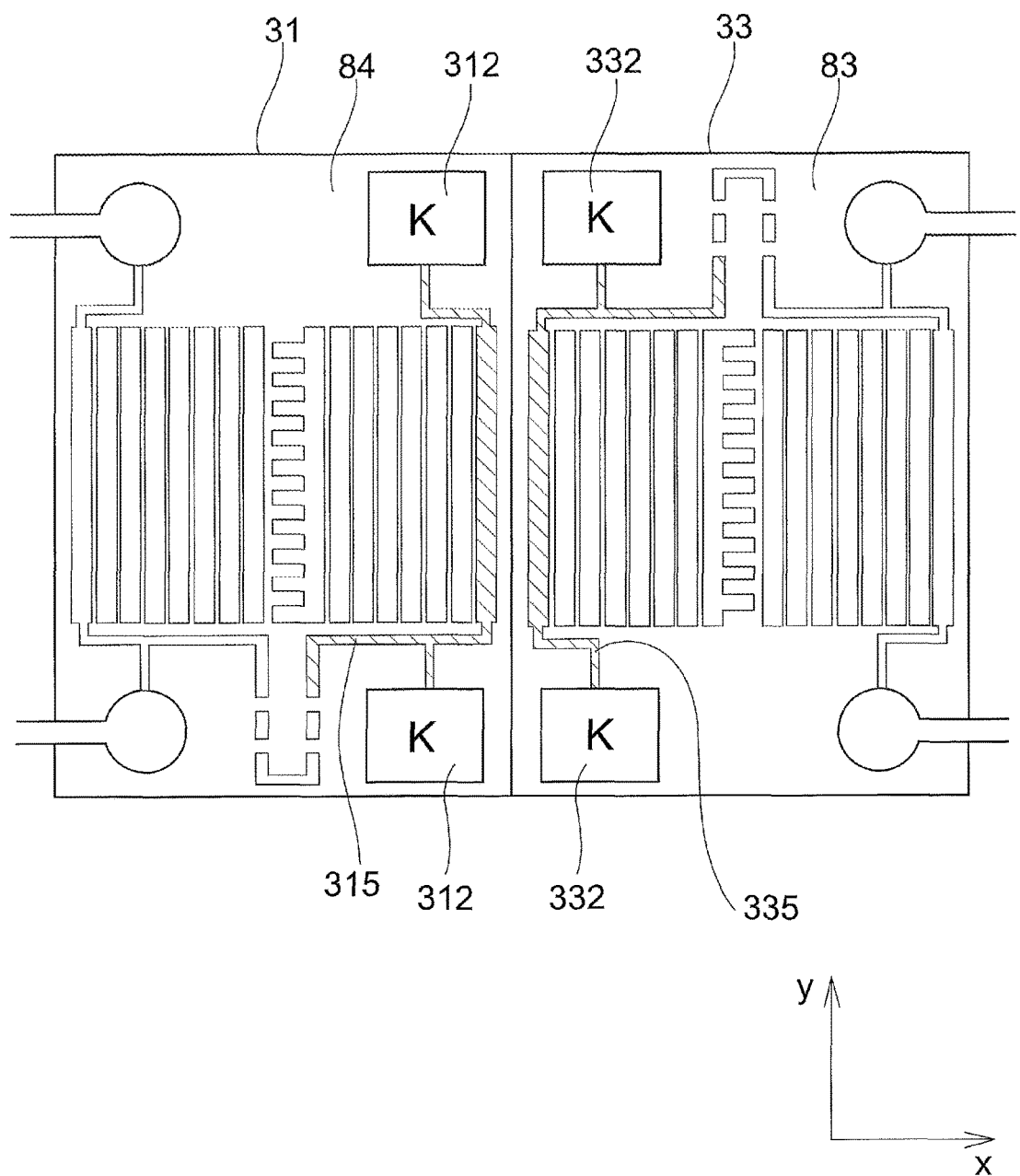
FIG. 4A is a view schematically illustrating a boundary between adjacent light emitting units in the light irradiation device of the first embodiment.

FIG. 4A is a view illustrating a boundary between the light emitting unit 31 and the light emitting unit 33. Meanwhile, in FIG. 4A and FIG. 4B, the LED element 15 is not illustrated for the sake of convenience. Also, in the wiring pattern, the first wiring area is marked with a right diagonal line and the second wiring area is marked with a left diagonal line.

The LED substrate 83 on the x direction side (right side of the drawing) illustrated in FIG. 4A is the LED substrate provided in the light emitting unit 33, and an LED substrate 84 on the −x direction side (left side of the drawing) is the LED substrate provided in the light emitting unit 31.

As illustrated in FIG. 4A, the light emitting units 31 and 33 are arranged such that the second wiring areas (315 and 335) of the LED substrates (84 and 83) are adjacent to each other and the second feeding terminals (312 and 332) are adjacent to each other. In addition, the light emitting unit 31 and the light emitting unit 33 are arranged such that the first wiring areas (not illustrated) of the LED substrates (84 and 83) are separated from each other and the first feeding terminals (not illustrated) are separated from each other. In other words, while a direction from the first wiring area (not illustrated) to the second wiring area 315 in the light emitting unit 31 is the x direction, a direction from the first wiring area (not illustrated) to the second wiring area 335 in the light emitting unit 33 is the −x direction, so that they are in a relationship of opposite directions. More generally speaking, in the light emitting unit 31 and the light emitting unit 33, the directions from the first wiring area to the second wiring area are different, and they are symmetrical with respect to the boundary of the LED substrates (84 and 83).

Meanwhile, an interval between the second wiring area 315 of the light emitting unit 31 and the second wiring area 335 of the light emitting unit 33 (more specifically, the interval between the areas in which the LED elements are arranged) is, for example, 1.8 mm. The interval between the second feeding terminal 312 of the light emitting unit 31 and the second feeding terminal 332 of the light emitting unit 33 is, for example, 2.1 mm.

Figure 4B:
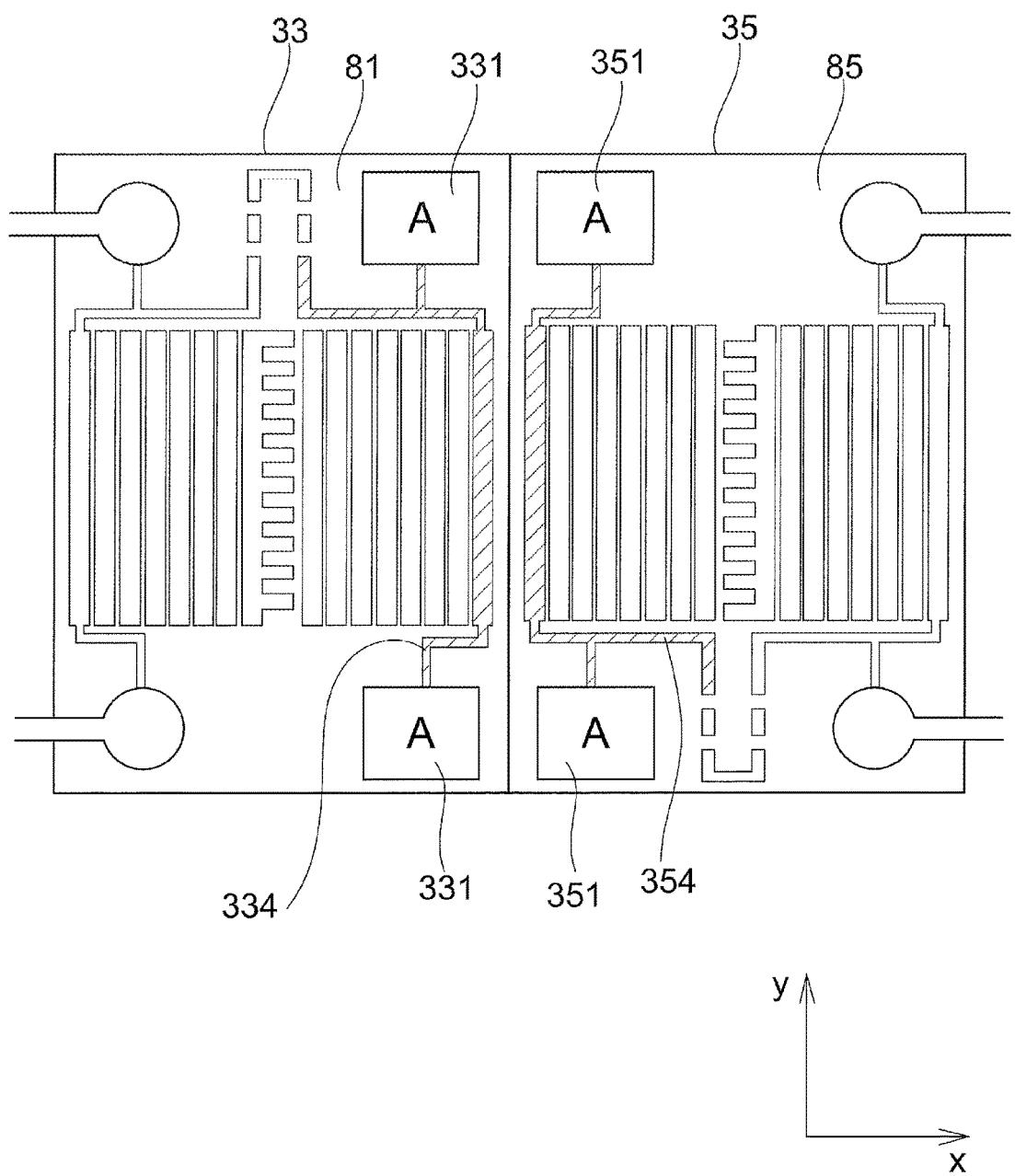
FIG. 4B is a view schematically illustrating the boundary between the adjacent light emitting units in the light irradiation device of the first embodiment.

FIG. 4B is a view illustrating a boundary between the light emitting unit 33 and the light emitting unit 35. The LED substrate 85 on the x direction side (right side of the drawing) illustrated in FIG. 4B is the LED substrate provided in the light emitting unit 35, and the LED substrate 81 on the −x direction side (left side of the drawing) is the LED substrate provided in the light emitting unit 33.

As illustrated in FIG. 4B, the light emitting units 33 and 35 are arranged such that the first wiring areas (334 and 354) of the LED substrates (81 and 85) are adjacent to each other and the first feeding terminals (331 and 351) are adjacent to each other. In addition, the light emitting unit 33 and the light emitting unit 35 are arranged such that the second wiring areas (not illustrated) of the LED substrates (81 and 85) are separated from each other and the second feeding terminals (not illustrated) are separated from each other. In other words, while a direction from the first wiring area 334 to the second wiring area (not illustrated) in the light emitting unit 33 is the −x direction, a direction from the first wiring area 354 to the second wiring area (not illustrated) in the light emitting unit 35 is the x direction, so that they are in a relationship of opposite directions. More generally speaking, in the light emitting unit 33 and the light emitting unit 35, the directions from the first wiring area to the second wiring area are different, and they are symmetrical with respect to the boundary of the LED substrates (81 and 85).

Meanwhile, an interval between the first wiring area 334 of the light emitting unit 33 and the first wiring area 354 of the light emitting unit 35 (more specifically, the interval between the areas in which the LED elements are arranged) is, for example, 1.8 mm. The interval between the first feeding terminal 331 of the light emitting unit 33 and the first feeding terminal 351 of the light emitting unit 35 is, for example, 2.1 mm.

Although not illustrated, the light emitting units 35 and 37 are arranged such that the second wiring areas are adjacent to each other and the second feeding terminals are adjacent to each other as illustrated in FIG. 4A. Although not illustrated, the light emitting unit 37 and the light emitting unit 39 are arranged such that the first wiring areas are adjacent to each other and further the first feeding terminals are adjacent to each other as illustrated in FIG. 4B.

As described above, at the boundary of all the adjacent light emitting units (31, 33, 35, 37, and 39), the first wiring areas are adjacent to each other and the first feeding terminals are adjacent to each other, or the second wiring area are adjacent to each other and the second feeding terminals are adjacent to each other.

(Comparative Example)

Subsequently, a light irradiation device of a comparative example is described. The light irradiation device of the comparative example is similar to a light irradiation device 1 of the first embodiment in configuration except polarity in adjacent light emitting units. Hereinafter, with reference to FIG. 5, the polarity of the adjacent light emitting units in the light irradiation device of the comparative example is described. Meanwhile, in FIG. 5, as FIG. 4A and FIG. 4B, an LED element 15 is not illustrated, a first wiring area of a wiring pattern is marked with a right diagonal line and a second wiring area is marked with a left diagonal line.

Figure 5:
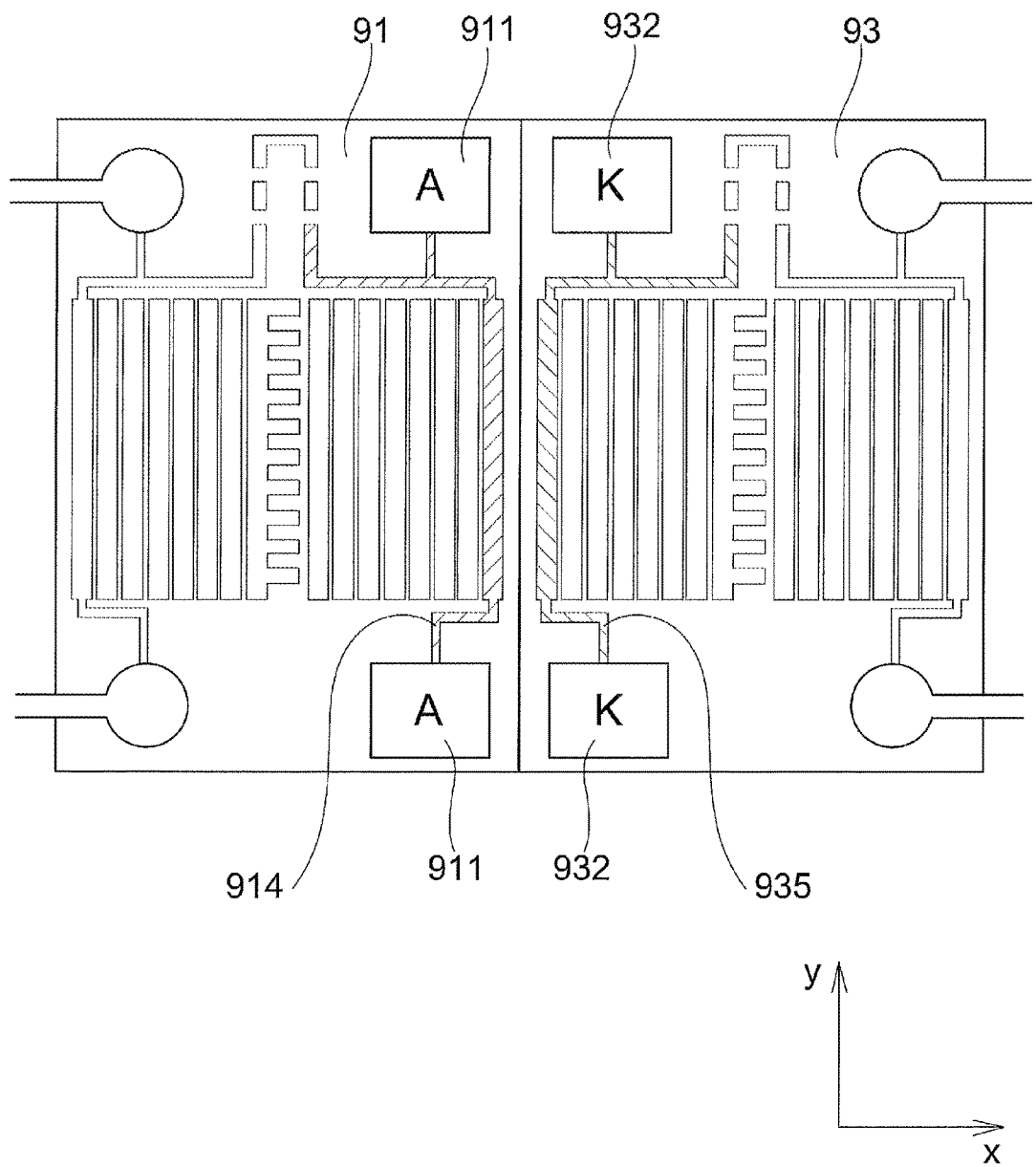
FIG. 5 is a view schematically illustrating a boundary between adjacent light emitting units in a light irradiation device of a comparative example.

Although not illustrated, the light irradiation device of the comparative example includes five light emitting units just like the light irradiation device 1 of the first embodiment. FIG. 5 is a view schematically illustrating a boundary between adjacent light emitting units (91 and 93) out of the five light emitting units in the light irradiation device of the comparative example.

As illustrated in FIG. 5, the light emitting unit 91 and the light emitting unit 93 are arranged such that a first wiring area 914 of the light emitting unit 91 and a second wiring area 935 of the light emitting unit 93 are adjacent to each other and a second wiring area (not illustrated) of the light emitting unit 91 and a first wiring area (not illustrated) of the light emitting unit 93 are separated from each other. Also, they are arranged such that a first feeding terminal 911 of the light emitting unit 91 and a second feeding terminal 932 of the light emitting unit 93 are adjacent to each other and a second feeding terminal (not illustrated) of the light emitting unit 91 and a first feeding terminal (not illustrated) of the light emitting unit 93 are separated from each other. In other words, a direction from the first wiring area 914 to the second wiring area (not illustrated) in the light emitting unit 91 is a −x direction and a direction from the first wiring area (not illustrated) to the second wiring area 935 in the light emitting unit 93 is a −x direction, so that they coincide with each other.

In the light irradiation device of the comparative example, at a boundary of all adjacent light emitting units, the first wiring area in each light emitting unit is adjacent to the second wiring area in the light emitting unit to the right as illustrated in FIG. 5. In addition, the first feeding terminal in each light emitting unit is adjacent to the second feeding terminal in the light emitting unit to the right.

(Verification)

The inventors of the present invention constructed the light irradiation device of the comparative example and supplied current to each light emitting unit. Then, it was confirmed that creeping discharge occurs along an LED substrate at the boundary between the adjacent light emitting units. Hereinafter, this phenomenon is specifically described.

As in the light irradiation device 1 of the first embodiment, the five light emitting units of the light irradiation device of the comparative example are connected to different power supplies. Specifically, the five light emitting units are connected to power supplies of 192 V, 128 V, 128 V, 128 V, and 192 V in order in a direction to right (x direction in FIG. 1).

In such light irradiation device of the comparative example, the creeping discharge occurred at a specific boundary out of the boundary between the adjacent light emitting units. Specifically, in a case where the light emitting unit connected to the power supply of 128 V was located to the right of the light emitting unit connected to the power supply of 192 V, the creeping discharge occurred at the boundary between the two light emitting units. Meanwhile, no creeping discharge occurred at the boundary between other adjacent light emitting units.

The inventors of the present invention considers as follows as a reason for the occurrence of the creeping discharge in the light irradiation device of the comparative example.

In the light irradiation device of the comparative example, the first wiring area in each light emitting unit is adjacent to the second wiring area in the light emitting unit to the right and the first feeding terminal of each light emitting unit is adjacent to the second feeding terminal in the light emitting unit to the right as illustrated in FIG. 5. Therefore, in a case where the light emitting unit on the left side is connected to the power supply of 192 V, a potential difference of 192 V is generated between the first feeding terminal and the first wiring area in the light emitting unit on the left side and the second feeding terminal and the second wiring area in the light emitting unit on a right side.

Herein, as illustrated in FIG. 5, a distance between the second wiring area 935 in the light emitting unit 93 on the right side and the first wiring area 914 in the light emitting unit 91 on the left side is small. As an example, the distance is 1.8 mm. As in the light irradiation device 1 of the first embodiment, in the light irradiation device of the comparative example also, the first wiring area and the second wiring area are formed on ends of the LED substrates (91 and 93) so as to secure an area for arranging the LED element 15 on each LED substrate (91 and 93).

As illustrated in FIG. 5, a distance between the second feeding terminal 932 of the light emitting unit 93 on the right side and the first feeding terminal 911 of the light emitting unit 91 on the left side is also small. As an example, the distance is 2.1 mm. This is because, in the light irradiation device of the comparative example also, each LED substrate is arranged at a narrow interval so as to realize high density mounting of the LED elements 15 as in the light irradiation device 1 of the first embodiment.

The inventors of the present invention considered that, in a case where the light emitting unit connected to the power supply of 128 V is located to the right of the light emitting unit connected to the power supply of 192 V, a high potential difference of 192 V occurred between the feeding terminals and between the wiring areas arranged at narrow intervals as described above, and as a result, the creeping discharge occurred.

In order to prevent occurrence of such creeping discharge, it is also conceivable to widen the interval between adjacent feeding terminals and the interval between adjacent wiring areas. However, as described in the section of the problems to be solved by the invention, widening the interval between the feeding terminals and the interval between the wiring areas is not preferable because this interferes with the high density mounting of the LED elements.

Meanwhile, according to the safety standards IEC 60950 regarding information technology equipment, it is described that, in a case where the potential difference of 192 V occurs, the creeping discharge can be prevented by providing an interval of 2.5 mm between adjacent conductors. However, as described above, the interval between the feeding terminals is, for example, 2.1 mm, and the interval between the wiring areas is, for example, 1.8 mm. When the interval between the feeding terminals and the interval between the wiring areas are extended to 2.5 mm, the high density mounting of the LED elements cannot be realized.

Therefore, the inventors of the present invention constructs the light irradiation device 1 of the first embodiment and supplies current to each of the light emitting units (31, 33, 35, 37, and 39), and may confirm that the creeping discharge does not occur at any boundary between the adjacent light emitting units. The inventors of the present invention considers as follows as for the reason for preventing the occurrence of the creeping discharge according to the light irradiation device 1 of the first embodiment.

As illustrated in FIG. 4A and FIG. 4B, according to the light irradiation device 1 of the first embodiment, the wiring areas of the same polarity are adjacent to each other, and the feeding terminals of the same polarity are adjacent to each other in adjacent light emitting units. Specifically, in the case of FIG. 4A, the cathode polarities are adjacent, and in the case of FIG. 4B, the anode polarities are adjacent.

In the case where the cathode polarities are adjacent to each other as illustrated in FIG. 4A, the potential difference generated between the wiring areas (315 and 335) and between the feeding terminals (312 and 332) is 0 V. Also, in the case where the anode polarities are adjacent to each other as illustrated in FIG. 4B, the potential difference generated between the wiring areas (334 and 354) and the feeding terminals (331 and 351) is 64 V or 0 V. More specifically, in a case where the light emitting unit connected to the power supply of 128 V and the light emitting unit connected to the power supply of 192 V are adjacent to each other as in the light emitting unit 37 and the light emitting unit 39 (refer to FIG. 1), the potential difference is a difference between 192 V and 128 V, that is, 64 V. Also, in a case where the light emitting units connected to the power supply of 128 V are adjacent to each other as in the light emitting unit 33 and the light emitting unit 35 (refer to FIG. 1), the potential difference is a difference between 128 V and 128 V, that is, 0 V.

As described above, according to the light irradiation device 1 of the first embodiment, the potential difference at the boundary between the adjacent light emitting units is 0 V or 64 V, which is significantly smaller than the potential difference in the light irradiation device of the comparative example. As a result, according to the light irradiation device 1 of the first embodiment, occurrence of the creeping discharge may be suppressed without expanding the interval between the adjacent feeding terminals and the interval between the adjacent wiring areas. That is, according to the light irradiation device 1 of the first embodiment, the high density mounting of the LED elements may be realized while suppressing the occurrence of the creeping discharge.

Furthermore, according to the safety standards IEC 60950 regarding information technology equipment, it is described that, when the potential difference of 64 V occurs, the creeping discharge can be prevented by providing an interval of 1.6 mm between adjacent conductors. Therefore, it is also possible to narrow the interval (for example, 2.1 mm) between the adjacent feeding terminals and the interval (1.8 mm) between the adjacent wiring areas to 1.6 mm, which further facilitates downsizing of the light irradiation device.

(Second Embodiment)

Subsequently, a light irradiation device in a second embodiment is described. In the light irradiation device 1 of the first embodiment, the directions from the first wiring area to the second wiring area in the adjacent light emitting units are opposite to each other (refer to FIG. 4A and FIG. 4B). On the other hand, in the light irradiation device of the second embodiment, directions from a first wiring area to a second wiring area are the same in adjacent light emitting units. Hereinafter, a difference between such light irradiation device of the second embodiment and the light irradiation device 1 of the first embodiment is mainly described.

Figure 6:
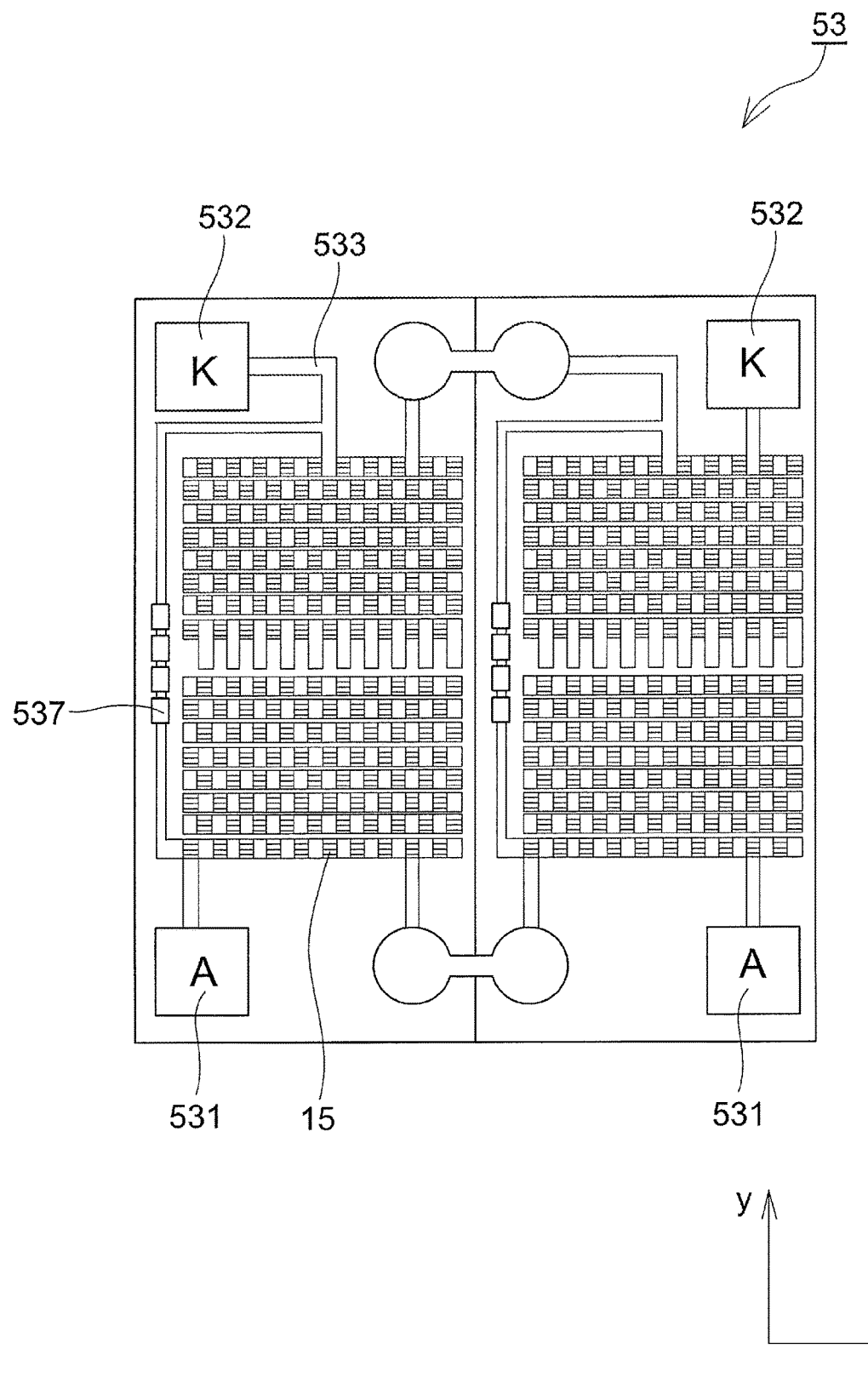
FIG. 6 is a view schematically illustrating a configuration of a light emitting unit in a light irradiation device of a second embodiment.

The light irradiation device of the second embodiment includes five light emitting units as in the light irradiation device 1 of the first embodiment. FIG. 6 is a view schematically illustrating one light emitting unit 53 of the five light emitting units included in the light irradiation device of the second embodiment. Just like the light emitting unit 33 of the first embodiment, the light emitting unit 53 includes a first feeding terminal 531, a second feeding terminal 532, an LED element 15, a wiring pattern 533, and a Zener diode 537.

Meanwhile, in FIG. 6, a direction in which the five light emitting units are arranged is an x direction, and a direction orthogonal to the x direction is a y direction.

As illustrated in FIG. 6, 16 LED elements 15 are arranged in the y direction on each LED substrate, and 10 LED elements 15 are arranged in the x direction. The 16 LED elements 15 arranged in the y direction are electrically connected in series, and 10 groups of the 16 LED elements 15 are electrically connected in parallel in the x direction. That is, the light irradiation device of the second embodiment is different from the light irradiation device 1 of the first embodiment in the direction in which the LED elements 15 are connected in series and the direction in which they are connected in parallel.

Subsequently, with reference to FIG. 7, polarity at a boundary between adjacent light emitting units in the light irradiation device of the second embodiment is described. Meanwhile, in FIG. 7, as in FIG. 4A and FIG. 4B, the LED element 15 is not illustrated, the first wiring area of the wiring pattern is marked with a right diagonal line and the second wiring area is marked with a left diagonal line.

Figure 7:
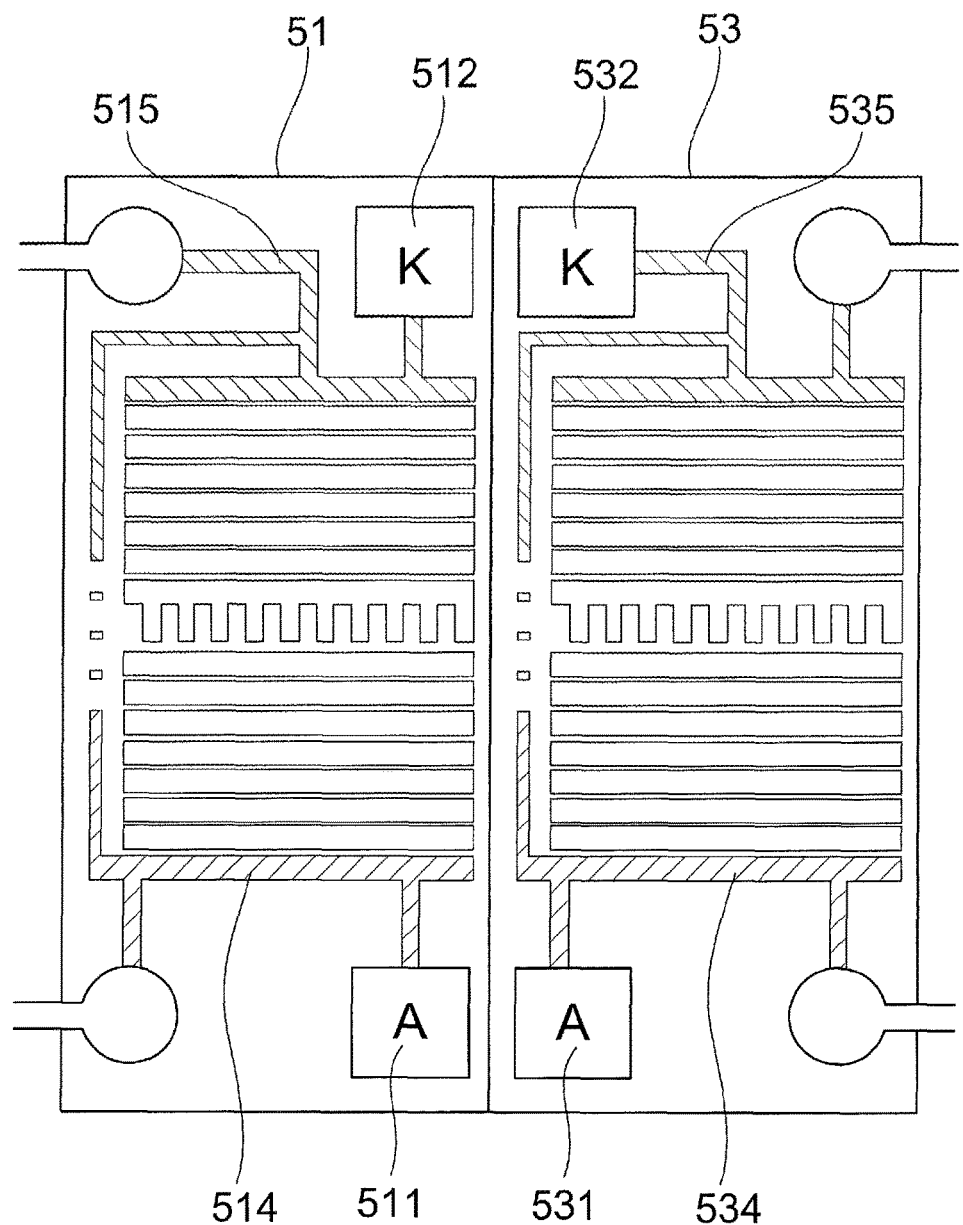
FIG. 7 is a schematic diagram for illustrating a wiring pattern in the light irradiation device of the second embodiment.

FIG. 7 is a view illustrating the boundary between adjacent light emitting units 51 and 53 in the light irradiation device according to the second embodiment. A first wiring area 514 of the light emitting unit 51 and a first wiring area 534 of the light emitting unit 53 are adjacent to each other and a second wiring area 515 of the light emitting unit 51 and the second wiring area 535 of the light emitting unit 53 are adjacent to each other as illustrated in FIG. 7. Also, a first feeding terminal 511 of the light emitting unit 51 and the first feeding terminal 531 of the light emitting unit 53 are adjacent to each other, and a second feeding terminal 512 of the light emitting unit 51 and the second feeding terminal 532 of the light emitting unit 53 are adjacent to each other. Meanwhile, in the light emitting unit 51 and the light emitting unit 53, the directions from the first wiring area (514 and 534) to the second wiring area (515 and 535) are the y direction, so that they are in the same direction.

In the light irradiation device of the second embodiment, as for not only the light emitting units 51 and 53 but also all the adjacent light emitting units, the polarity at the boundary of the light emitting units is as illustrated in FIG. 7. That is, the wiring areas of the same polarity and the feeding terminals of the same polarity are arranged so as to be adjacent to each other.

Therefore, according to the light irradiation device of the second embodiment, occurrence of creeping discharge can be suppressed for the reason similar to that of the light irradiation device 1 of the first embodiment, and further, high density mounting of the LED elements can be realized.

However, in the light irradiation device of the second embodiment, as illustrated in FIG. 6, the wiring pattern 533 for connecting the Zener diode 537 between the first feeding terminal 531 and the second feeding terminal 532 extends in the y direction. The LED element 15 is not arranged on the wiring pattern 533. Therefore, there is a possibility that illuminance of emission light decreases at the boundary between adjacent light emitting units. On the other hand, since the light irradiation device 1 of the first embodiment can arrange the LED elements 15 at equal intervals, this is more effective than the light irradiation device of the second embodiment from the viewpoint of uniform illuminance.

As described above, in the light irradiation device of the second embodiment, the direction in which the LED elements 15 are connected in series and the direction in which they are connected in parallel are different from that in the light irradiation device 1 of the first embodiment. More specifically, in the light irradiation device of the second embodiment, as illustrated in FIG. 6, 16 LED elements 15 arranged in the y direction are electrically connected in series, and 20 groups of the 16 LED elements 15 are electrically connected in parallel in the x direction.

When the number of the LED elements 15 connected in parallel is large in this manner, it is necessary to apply large current to a power supply cable, and a heat generation amount of the power supply cable increases. In addition, it is necessary to use a cable with a large diameter in order to suppress heat generation, which is not preferable from the viewpoint of device design.

On the other hand, in the light irradiation device 1 of the first embodiment, as illustrated in FIG. 2, 32 LED elements 15 arranged in the x direction are electrically connected in series, and 10 groups of the 32 LED elements 15 are electrically connected in parallel in the y direction. That is, in the light irradiation device 1 of the first embodiment, the number of the LED elements 15 connected in parallel is smaller than that of the light irradiation device of the second embodiment. Therefore, in the light irradiation device 1 of the first embodiment, as compared with the light irradiation device of the second embodiment, small current flows through the power supply cable, so that the heat generation amount of the power supply cable does not increase. Also, in the light irradiation device 1 of the first embodiment, even if the number of the LED substrates 8 connected in the x direction is increased in each light emitting unit, the number of the LED elements 15 connected in parallel does not change, so that the heat generation of the power supply cable does not increase.

(Another Embodiment)

Meanwhile, the light irradiation device is not limited to the configuration of the above-described embodiment, and it goes without saying that various modifications may be made without departing from the scope of the present invention. For example, it is a matter of course that a configuration according to another embodiment described below may be arbitrarily selected and adopted to the configuration according to the above embodiment.

<1> In the light irradiation device 1 of the first embodiment, at the boundary between all adjacent light emitting units (31, 33, 35, 37, and 39), the first wiring areas are adjacent to each other and the first feeding terminals are adjacent to each other, or the second wiring areas are adjacent to each other and the second feeding terminals are adjacent to each other, but the present invention is not limited thereto. That is, it is sufficient that, at least at the boundary between the light emitting units (31 and 33) where the creeping discharge occurs, the feeding terminals of the same polarity are adjacent to each other and the wiring areas of the same polarity are adjacent to each other.

Figure 8A:
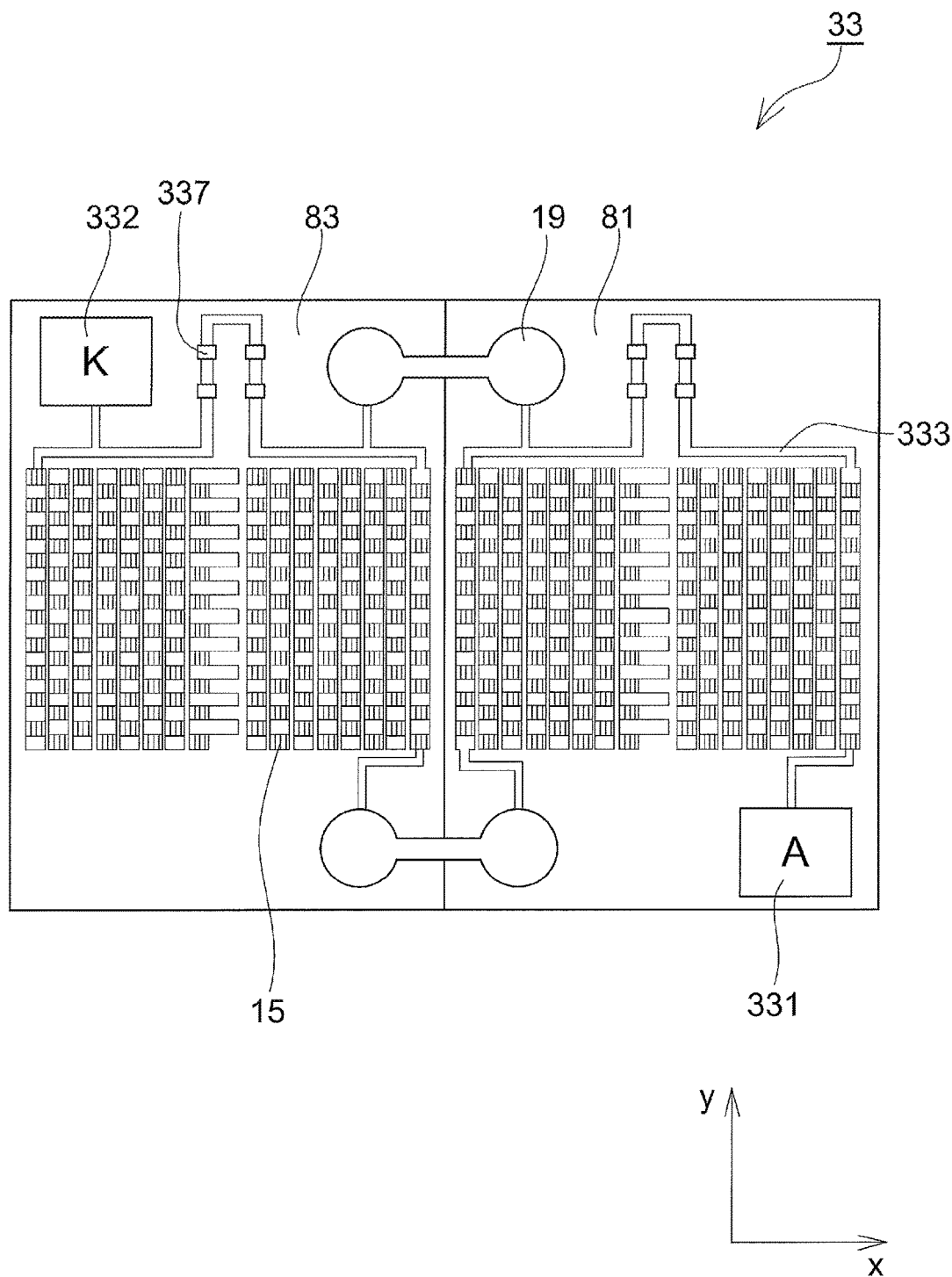
FIG. 8A is a view schematically illustrating a configuration of a light emitting unit in a light irradiation device according to another embodiment.
Figure 8B:
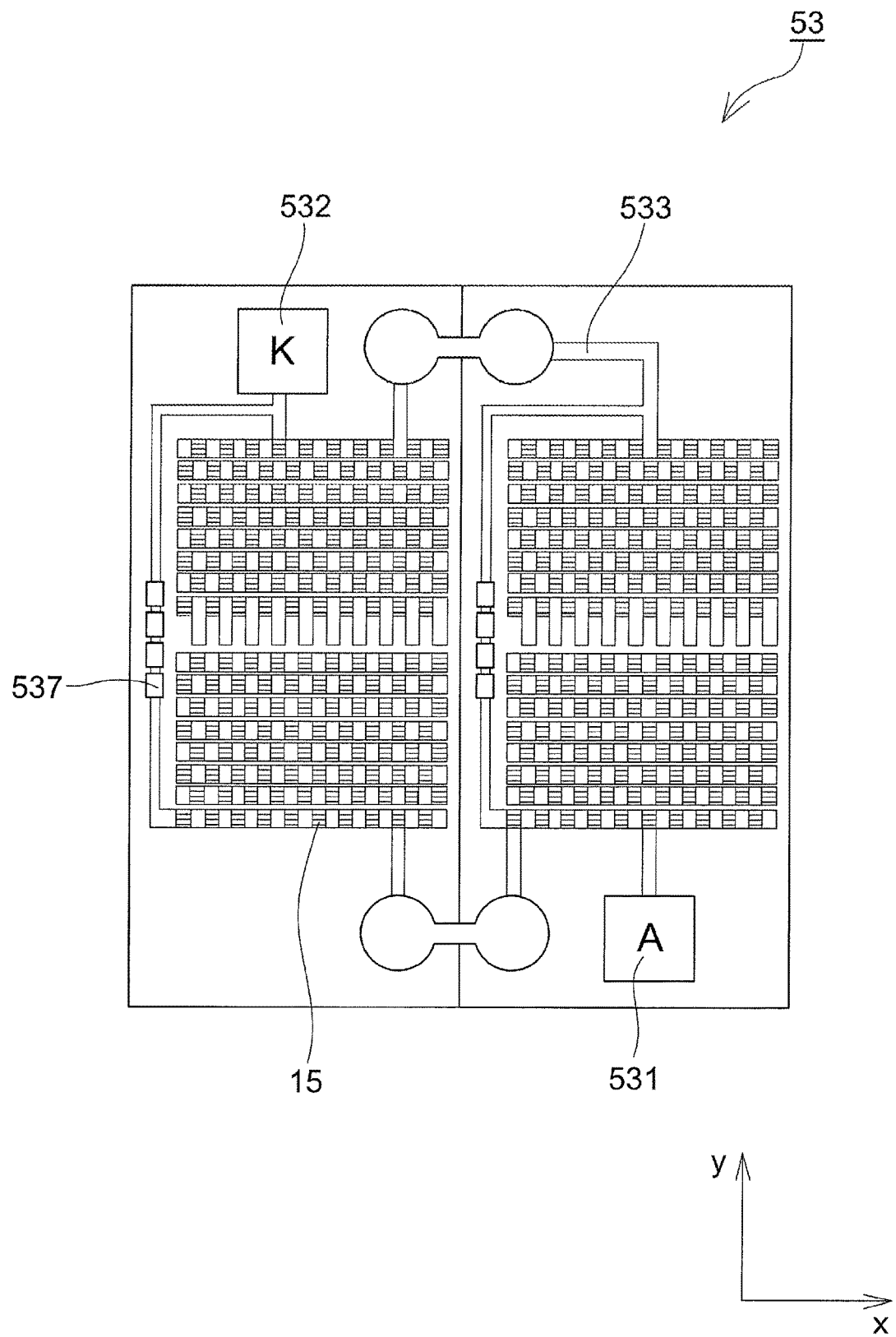
FIG. 8B is a view schematically illustrating a configuration of the light emitting unit in the light irradiation device according to another embodiment.
Figure 9:
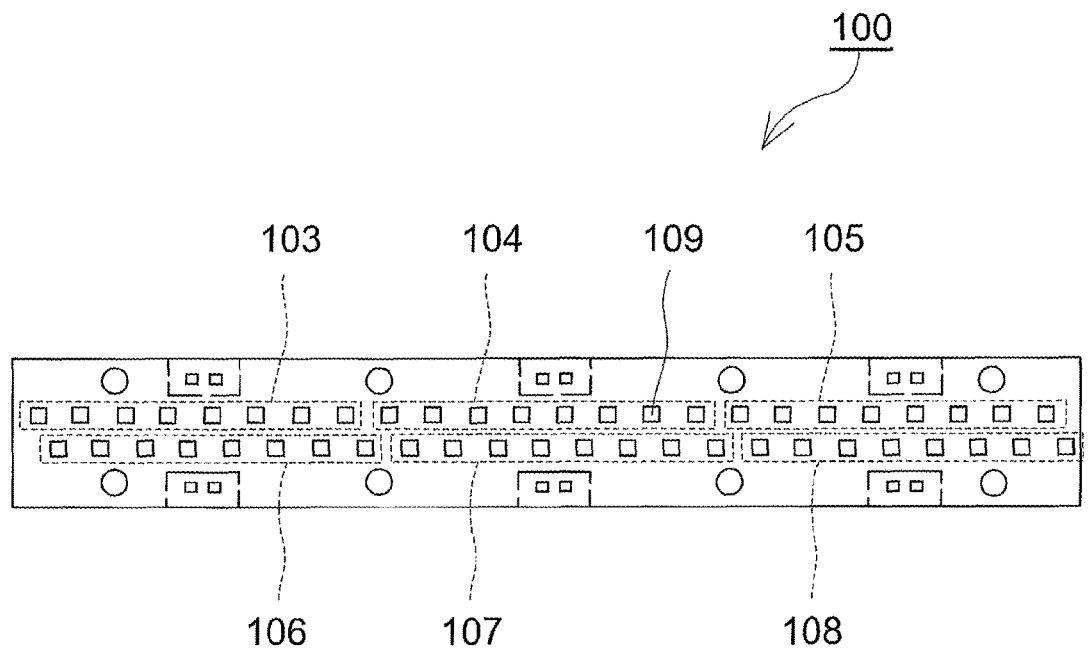
FIG. 9 is a view schematically illustrating a configuration of a conventional light irradiation device.
Figure 9:
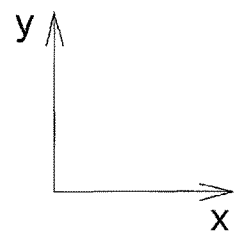

<2> In the light irradiation device 1 according to the first embodiment, each light emitting unit (31, 33, 35, 37, and 39) includes two first feeding terminals and two second feeding terminals, but the present invention is not limited thereto. For example, it is also possible to configure such that one first feeding terminal and one second feeding terminal are included as the light emitting unit 33 illustrated in FIG. 8A and the light emitting unit 53 illustrated in FIG. 8B. In addition, it is also possible to include three or more first feeding terminals and three or more second feeding terminals. Meanwhile, according to the first embodiment, since the first feeding terminals and the second feeding terminals are arranged so as to face each other across a plurality of LED elements 15, an arrangement area of the LED elements 15 is not reduced, and the high density mounting of the LED elements 15 may be realized.

<3> In the above-described embodiment, it is described that the first wiring area in the wiring pattern is the area having the same potential as the first feeding terminal and the second wiring area is the area having the same potential as the second feeding terminal (refer to FIG. 3), but it is not limited thereto. That is, the potential of the first wiring area only needs to be closer to the potential of the first feeding terminal as compared with the potential of the second wiring area and the potential of the intermediate area, and the potential of the second wiring area only needs to be closer to the potential of the second feeding terminal as compared to the potential of the first wiring area and the potential of the intermediate area. In other words, the first wiring area may be an area having the potential the closest to the potential of the first feeding terminal, and the second wiring area may be an area having the potential the closest to the potential of the second feeding terminal. Meanwhile, the fact that the potentials are the same and that the potential is the closest are collectively referred to as "arranged in the electrically closest position".

<4> Also, the light irradiation device 1 may be one without the heat sink 5 and the water cooling block 7 provided. In addition, although the light emitting unit 3 is formed of five light emitting units (31, 33, 35, 37, and 39), the number of light emitting units is not limited thereto. Each of the five light emitting units (31, 33, 35, 37, and 39) includes two or three LED substrates 8, but this may also be formed of one LED substrate. In addition, it is not necessarily configured such that the LED substrates 8 are different for the respective light emitting units (31, 33, 35, 37, and 39), and it is also possible that five light emitting units are formed on one LED substrate 8. Meanwhile, as in the light irradiation device 1 of the first embodiment, by forming each light emitting unit of a plurality of LED substrates 8, the light emitting unit 3 may have multiple wavelengths and illuminance distribution may be improved. Also, when damage or the like occurs in a certain LED substrate 8, the substrate can be repaired, replaced, and the like.

DESCRIPTION OF REFERENCE SIGNS

1: Light irradiation device of first embodiment
3: Light emitting unit
31, 33, 35, 37, 39: Light emitting unit
331, 351: First feeding terminal
312, 332: Second feeding terminal
333, 533: Wiring pattern
334, 354: First wiring area
315, 335: Second wiring area
336: Intermediate area
337: Zener diode
5: Heatsink
7: Water cooling block
8: LED substrate
81, 83, 84, 85: LED substrate
11, 13: Piping joint
15: LED element
51, 53: LED substrate of second embodiment 511, 531: First feeding terminal of second embodiment
512, 532: Second feeding terminal of second embodiment
514, 534: First wiring area of second embodiment
515, 535: Second wiring area of second embodiment
91, 93: LED substrate of comparative example
911: First feeding terminal of comparative example
932: Second feeding terminal of comparative example
914: First wiring area of comparative example
935: Second wiring area of comparative example

The invention claimed is:

1. A light irradiation device comprising:
a plurality of substrates; and
a plurality of light emitting units mounted on each of the plurality of substrates that emit light when current is supplied, wherein
each of the plurality of light emitting units includes
a first feeding terminal indicating anode polarity and a second feeding terminal indicating cathode polarity, connected to a power supply,
a light emitting element group including a plurality of light emitting elements that are connected in series and are connected in parallel, and
a wiring pattern formed so as to electrically connect the first feeding terminal, the light emitting element group, and the second feeding terminal in series,
the wiring pattern includes
a first wiring area located between the first feeding terminal and a light emitting element arranged in a position electrically the closest to the first feeding terminal, and
a second wiring area located between the second feeding terminal and a light emitting element arranged in a position electrically the closest to the second feeding terminal, and
in two light emitting units from among the plurality of light emitting units mounted on two adjacently arranged substrates from among the plurality of substrates, first wiring areas or second wiring areas are arranged with an interval narrower than an interval between the first wiring area of one light emitting unit and the second wiring area of the other light emitting unit.

2. The light irradiation device according to claim 1, wherein
in two adjacently arranged light emitting units out of the plurality of light emitting units, a direction from the first wiring area to the second wiring area in one light emitting unit is different from a direction from the first wiring area to the second wiring area in the other light emitting unit.

3. The light irradiation device according to claim 1, wherein
in two adjacently arranged light emitting units out of the plurality of light emitting units, a direction from the first wiring area to the second wiring area in one light emitting units is opposite to a direction from the first wiring area to the second wiring area in the other light emitting unit.

4. The light irradiation device according to claim 1, wherein
in all the adjacently arranged light emitting units out of the plurality of light emitting units, the first wiring areas or the second wiring areas are arranged with the interval narrower than the interval between the first wiring area of one light emitting unit and the second wiring area of the other light emitting unit.

5. The light irradiation device according to claim 1, wherein
each of the plurality of light emitting units includes two first feeding terminals and two second feeding terminals, and
the first feeding terminals are arranged so as to face each other across the plurality of light emitting elements and the second feeding terminals are arranged so as to face each other across the plurality of light emitting elements.

6. The light irradiation device according to claim 2, wherein
in two adjacently arranged light emitting units out of the plurality of light emitting units, a direction from the first wiring area to the second wiring area in one light emitting units is opposite to a direction from the first wiring area to the second wiring area in the other light emitting unit.

7. The light irradiation device according to claim 2, wherein
in all the adjacently arranged light emitting units out of the plurality of light emitting units, the first wiring areas or the second wiring areas are arranged with the interval narrower than the interval between the first wiring area of one light emitting unit and the second wiring area of the other light emitting unit.

8. The light irradiation device according to claim 3, wherein
in all the adjacently arranged light emitting units out of the plurality of light emitting units, the first wiring areas or the second wiring areas are arranged with the interval narrower than the interval between the first wiring area of one light emitting unit and the second wiring area of the other light emitting unit.

9. The light irradiation device according to claim 6, wherein
in all the adjacently arranged light emitting units out of the plurality of light emitting units, the first wiring areas or the second wiring areas are arranged with the interval narrower than the interval between the first wiring area of one light emitting unit and the second wiring area of the other light emitting unit.

10. The light irradiation device according to claim 2, wherein
each of the plurality of light emitting units includes two first feeding terminals and two second feeding terminals, and
the first feeding terminals are arranged so as to face each other across the plurality of light emitting elements and the second feeding terminals are arranged so as to face each other across the plurality of light emitting elements.

11. The light irradiation device according to claim 3, wherein
each of the plurality of light emitting units includes two first feeding terminals and two second feeding terminals, and
the first feeding terminals are arranged so as to face each other across the plurality of light emitting elements and the second feeding terminals are arranged so as to face each other across the plurality of light emitting elements.

12. The light irradiation device according to claim 4, wherein
each of the plurality of light emitting units includes two first feeding terminals and two second feeding terminals, and the first feeding terminals are arranged so as to face each other across the plurality of light emitting elements and the second feeding terminals are arranged so as to face each other across the plurality of light emitting elements.

13. The light irradiation device according to claim 6, wherein each of the plurality of light emitting units includes two first feeding terminals and two second feeding terminals, and the first feeding terminals are arranged so as to face each other across the plurality of light emitting elements and the second feeding terminals are arranged so as to face each other across the plurality of light emitting elements.

14. The light irradiation device according to claim 7, wherein each of the plurality of light emitting units includes two first feeding terminals and two second feeding terminals, and the first feeding terminals are arranged so as to face each other across the plurality of light emitting elements and the second feeding terminals are arranged so as to face each other across the plurality of light emitting elements.

15. The light irradiation device according to claim 8, wherein each of the plurality of light emitting units includes two first feeding terminals and two second feeding terminals, and the first feeding terminals are arranged so as to face each other across the plurality of light emitting elements and the second feeding terminals are arranged so as to face each other across the plurality of light emitting elements.

16. The light irradiation device according to claim 9, wherein each of the plurality of light emitting units includes two first feeding terminals and two second feeding terminals, and the first feeding terminals are arranged so as to face each other across the plurality of light emitting elements and the second feeding terminals are arranged so as to face each other across the plurality of light emitting elements.

* * * * *